(12) United States Patent
Ho et al.

(10) Patent No.: US 6,781,469 B2
(45) Date of Patent: Aug. 24, 2004

(54) PHASE-LOCKED LOOP HAVING PHASE DETECTOR ERROR SIGNAL RESHAPING AND METHOD THEREOF

(75) Inventors: Hsu-Feng Ho, Taipei (TW); Tse-Hsiang Hsu, Hsin-Chu (TW)

(73) Assignee: Mediatek Incorporation, Hsin-Chu Hsien (TW)

( * ) Notice: Subject to any disclaimer, the term of this patent is extended or adjusted under 35 U.S.C. 154(b) by 0 days.

(21) Appl. No.: 10/065,045

(22) Filed: Sep. 13, 2002

(65) Prior Publication Data

US 2004/0051592 A1 Mar. 18, 2004

(51) Int. Cl.[7] ............................................... H03L 7/00
(52) U.S. Cl. ..................... 331/16; 331/17; 331/11; 327/156; 327/157; 327/159; 375/375; 375/376
(58) Field of Search .............................. 331/16, 17, 11; 375/376, 375; 327/156, 157, 158, 159

(56) References Cited

U.S. PATENT DOCUMENTS

| | | | |
|---|---|---|---|
| 5,818,304 A | 10/1998 | Hogeboom | |
| 5,825,210 A | 10/1998 | Oh | |
| 5,889,828 A | 3/1999 | Miyashita et al. | |
| 6,040,742 A | 3/2000 | Bailey et al. | |
| 6,154,071 A | * 11/2000 | Nogawa | 327/156 |
| 6,285,219 B1 | 9/2001 | Pauls | |
| 6,326,826 B1 | 12/2001 | Lee et al. | |
| 6,525,612 B2 | * 2/2003 | Aoki | 331/11 |
| 2001/0030560 A1 | 10/2001 | Neron | |

FOREIGN PATENT DOCUMENTS

| | | |
|---|---|---|
| JP | 64-041522 | 2/1989 |
| JP | 09-046125 | 2/1995 |
| JP | 08-288843 | 11/1996 |
| JP | 10276086 A | 10/1998 |
| JP | 2000 261314 A | 3/1999 |
| JP | 2000 286699 A | 7/1999 |
| JP | 2000 049598 A | 2/2000 |
| JP | 2001 144608 A | 5/2001 |

* cited by examiner

*Primary Examiner*—Arnold Kinkead
(74) *Attorney, Agent, or Firm*—Winston Hsu

(57) ABSTRACT

A phase-locked loop includes a signal reshaper connected between a phase detector and a charge pump. The signal reshaper can be controlled by a controller to reshape the phase error signal based on the difference between the frequency of an output signal, output from a low pass filter, and a target frequency. The signal reshaper outputs a reshaped or unreshaped phase error signal to the charge pump. The unreshaped phase error signal causes the phase-locked loop to lock the frequency of a feedback signal to the frequency of an input signal. The reshaped phase error signal causes the charge pump to output a charge pump signal that synchronizes the frequency of the output signal with the target frequency.

9 Claims, 5 Drawing Sheets

PHASE-LOCKED LOOP HAVING PHASE DETECTOR ERROR SIGNAL RESHAPING AND METHOD THEREOF

BACKGROUND OF INVENTION

1. Field of the Invention

The present invention relates to phase-locked loop, and more specifically to a phase-locked loop employing error signal reshaping and an associated method.

2. Description of the Prior Art

Phase-locked loops are widely used in digital electronics, signal telemetry, and communications applications. Within these applications, phase-locked loops are extensively used for clock distribution and recovery, and demodulation of data.

Phase locked-loops operate by producing an oscillator frequency to match a frequency of an input signal. Consider a basic phase-locked loop 10 illustrated in FIG. 1. The phase-locked loop 10 includes a phase detector 12 that compares the phase of an input signal S1 with the phase of a feedback signal S2. The phase detector 12 generates a phase error signal associated with the difference between the phases of the signals S1 and S2. A frequency detector 13 is also provided to compare the frequency of the input signal S1 with the frequency of the feedback signal S2 and generate a frequency difference signal. Typically, the phase error signal is a pulsed signal where the width of a pulse describes the magnitude of the phase difference of the signals S1 and S2.

Further provided is a charge pump 14 that generates an amount of charge equivalent to the phase error signal or the frequency difference signal. The charge generated by the charge pump 14 causes a filter 16 to output a signal S3 to a voltage-controlled oscillator (VCO) 18. The filter 16 may be a loop filter or a low pass filter for example. The VCO 18 generates a periodic signal according to the output signal S3. A feedback frequency divider 20 divides the output of the VCO 18 and outputs the feedback signal S2 to the phase detector 12. Thus, a feedback loop is formed and the phase-locked loop 10 tends to lock the feedback signal S2 with the input signal S1. Output from the phase-locked loop 10 can be taken as the output signal S3 or as the feedback signal S2 depending on the application.

Numerous improvements have been made to the basic phase-locked loop 10 with respect to different fields of application. A particular design that offers improved operation at high frequencies is taught by Bailey et al. in U.S. Pat. No. 6,040,742, which is included herein by reference. An example of such a phase-locked loop is illustrated in FIG. 2. A phase locked-loop 30 includes a phase detector 32, a charge pump 34, a filter 36, and a VCO 38. The phase-locked loop 30 is similar to the phase-locked loop 10 except for the charge pump 34 and its interaction with the phase detector 32.

Operation of the phase-locked loop 30 is only briefly described as follows. The charge pump 34 has an UP current source that generates a DC UP current $I_{UP}$ and a DOWN current source that generates a DC DOWN current $I_{DN}$ that is dynamically controlled based on DOWN signals from the phase detector 32. The magnitudes of the UP current $I_{UP}$ and the DOWN current $I_{DN}$ are controlled by the voltages $V_{REF}$ and $V_C$ respectively and by a bias voltage $V_{DD}$. The charge pump 34 outputs a current $I_{CP}$ that has the constant UP component $I_{UP}$ that is decreased by the DOWN component $I_{DN}$ when the phase detector 32 outputs a DOWN pulse signal. The DOWN pulse signal output by the phase detector 32 describes the phase difference between the phase $\theta_{IN}$ of the input signal $F_{IN}$ and the phase $\theta_{OUT}$ of the output signal $F_{OUT}$. The charge pump 34 outputs current $I_{CP}$ controlling the filter 36 to output a voltage $V_{LF}$ that results in locking of the phase $\theta_{IN}$ of the signal $F_{IN}$ and the phase $\theta_{OUT}$ of the signal $F_{OUT}$. Because of differences in mobility of holes and electrons in CMOS circuitry, the phase-locked loop 30 has quicker response than the basic phase-locked loop 10.

Nevertheless, prior art phase-locked loops can still suffer from poor response. More specifically, phase-locked loops using frequency detectors in conjunction with phase detectors can have ranges where a given frequency cannot be properly locked.

SUMMARY OF INVENTION

It is therefore a primary objective of the present invention to provide a phase-locked loop having a signal reshaper for providing an increased responsiveness and for solving the problems of the prior art.

Briefly summarized, a preferred embodiment of the present invention includes a phase-locked loop having a signal reshaper connected between a phase detector and and a charge pump. The signal reshaper can reshape the phase error signal and outputs a reshaped or unreshaped phase error signal to the charge pump. The unreshaped phase error signal causes the charge pump to output a charge pump signal that changes the frequency of a feedback signal to match the frequency of an input signal, and the reshaped phase error signal causes the charge pump to output a charge pump signal that synchronizes an output signal with a target frequency.

According to a preferred embodiment of the present invention, when the frequency of the output signal is in a lower range that is lower than the target frequency, the signal reshaper reshapes the phase error signal to increase the frequency of the output signal out of the lower range. Furthermore, when the frequency of the output signal is in an upper range that is above the target frequency, the signal reshaper reshapes the phase error signal to decrease the frequency of the output signal out of the upper range.

According to a preferred embodiment of the present invention, the lower range and the upper range are frequency ranges where the unreshaped phase error signal is incapable of synchronizing the output signal with the target frequency.

According to a preferred embodiment of the present invention, the signal reshaper is a pulse reshaper and the phase error signal comprises up pulses and down pulses, and the pulse reshaper lengthens or shortens a period of a pulse of the phase error signal to reshape the phase error signal.

According to a preferred embodiment of the present invention, a controller can control the charge pump to increase or decrease an amplitude of a pulse to reshape the phase error signal.

It is an advantage of the present invention that the pulse reshaper and charge pump reshape pulses of the phase error signal to quickly synchronize the output signal with the target frequency.

It is a further advantage of the present invention the pulse reshaping provided by the pulse reshaper and the charge pump substantially reduces ranges of output signal frequencies that cannot be locked properly.

These and other objectives of the present invention will no doubt become obvious to those of ordinary skill in the art after reading the following detailed description of the preferred embodiment that is illustrated in the various figures and drawings.

DETAILED DESCRIPTION

The present invention will be described in two preferred embodiments, namely a first and a second. The first embodiment includes a frequency detector and a controller, whereas the second embodiment does not. Moreover, the first embodiment utilizes a pulse reshaper as a signal reshaper.

Figure 1:
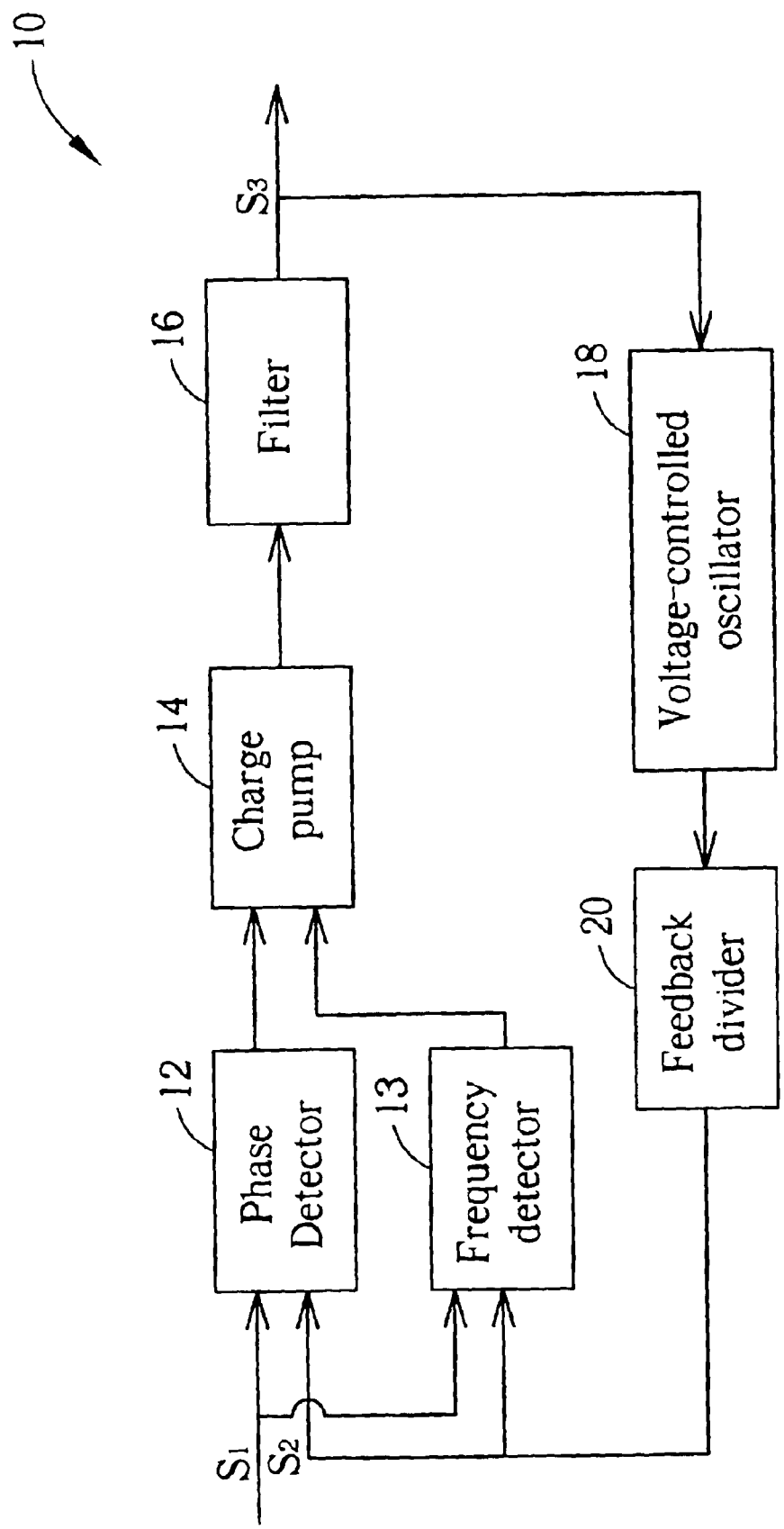
FIG. 1 is a block diagram of a prior art phase-locked loop.
Figure 2:
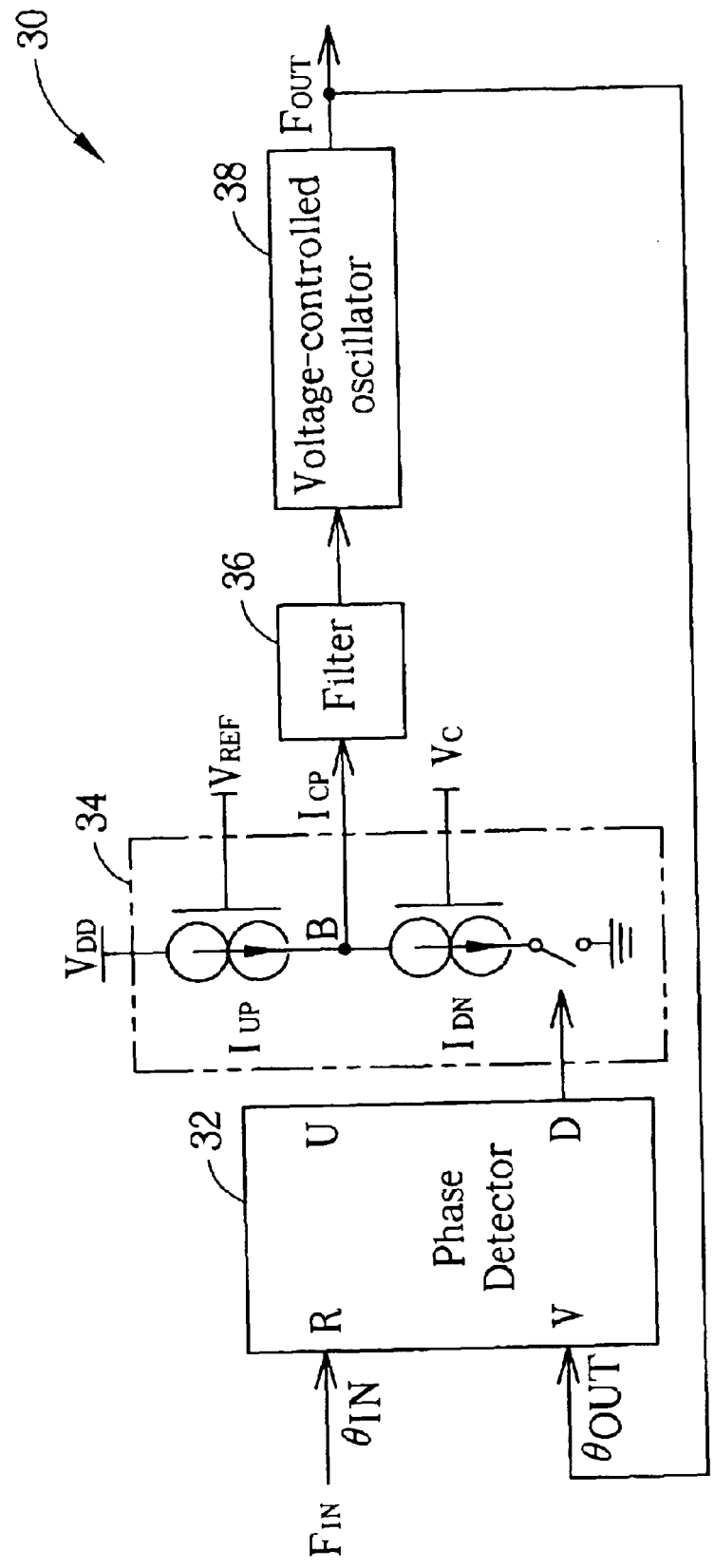
FIG. 2 is a block diagram of another prior art phase-locked loop.
Figure 3:
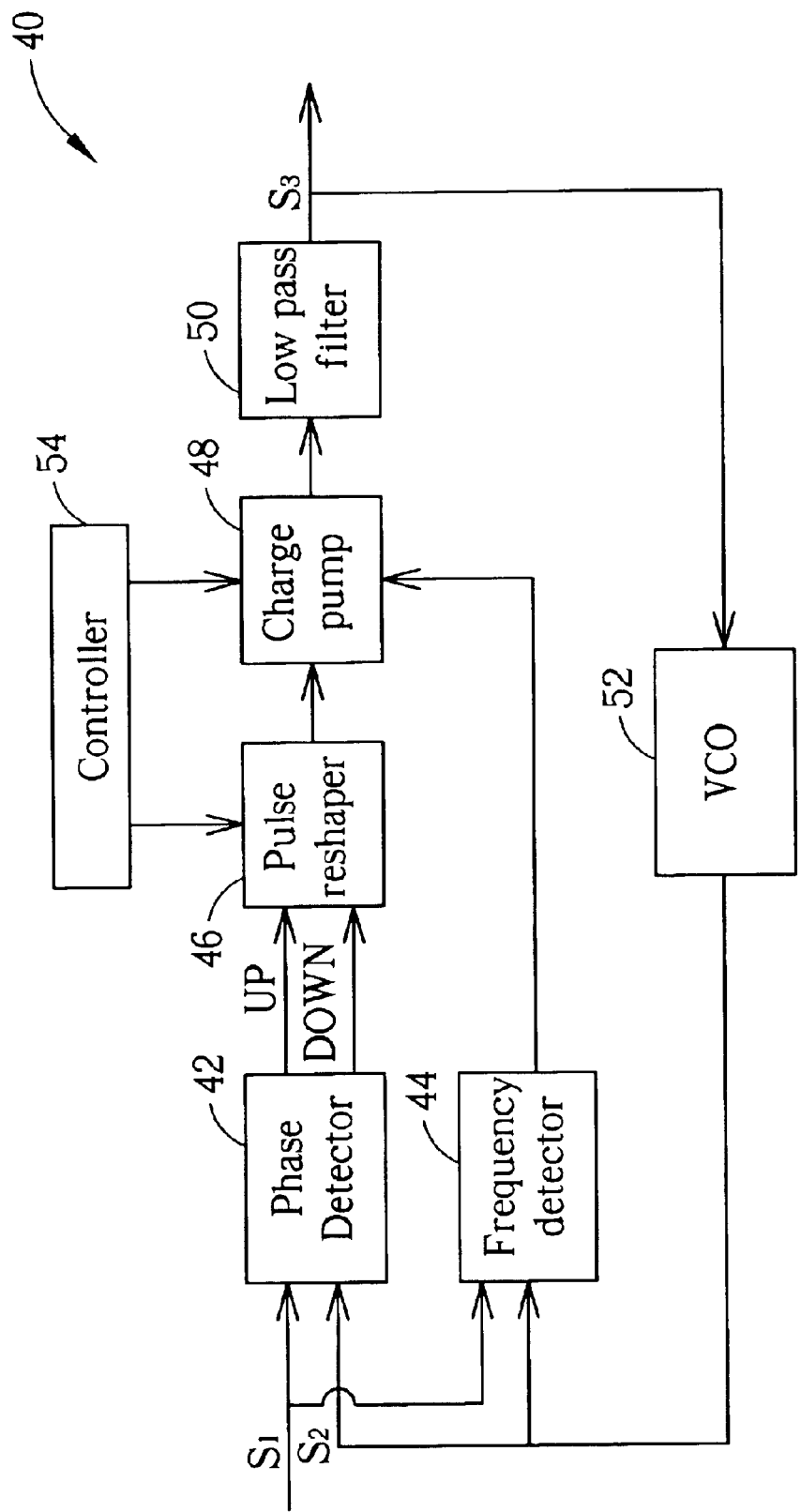
FIG. 3 is a block diagram of a phase-locked loop according to a first preferred embodiment of the present invention.

Please refer to FIG. 3. FIG. 3 shows a block diagram of a phase-locked loop 40 according to the first embodiment of the present invention. The phase-locked loop 40 includes a phase detector 42 and a frequency detector 44 for receiving an input signal S1 and a feedback signal S2. Connected to the phase detector 42 is a pulse reshaper 46 that reshapes pulses of a phase error signal output by the phase detector 42. Further included is a charge pump 48 that receives output from the pulse reshaper 46 and the frequency detector 44 and outputs a charge pump signal to a low pass filter 50. The low pass filter 50 outputs an output signal S3. An output of the low pass filter 50 is connected to a voltage-controlled oscillator (VCO) 52. The VCO 52 receives the output signal S3 and generates the feedback signal S2 accordingly. A controller 54 is provided to control the pulse reshaper 46 and the charge pump 48. The output signal S3 is taken as output from the phase-locked loop 40.

The phase detector 42 outputs a phase error signal comprising an UP signal and a DOWN signal. In the first embodiment, the UP and DOWN signals are pulsed signals. The relative frequency and timing of the UP and DOWN signal pulses depend on the phase difference between the input signal S1 and the feedback signal S2.

With the pulse reshaper 46 inactive, that is, not affecting the phase error signal, and the controller 54 also inactive, the phase-locked loop 40 behaves much the same as a prior art phase-locked loop. In other words, when the controller 54 does not control the pulse reshaper 46 or the charge pump 48 to modify any signals, the pulse reshaper 46 outputs an unreshaped phase error signal to the charge pump 48, which outputs a corresponding charge pump signal. In this way, the phase-locked loop 40 can change the frequency of the feedback signal S2 to match the frequency of the input signal S1.

When the pulse reshaper 46 is active and being controlled by the controller 54, the UP and DOWN pulses received from the phase detector 42 can be reshaped. Specifically, the pulse reshaper 46 can lengthen or shorted periods of the UP and DOWN pulses. For instance, the periods of the UP pulses can be lengthened, or the periods of the DOWN pulses shortened, to cause the charge pump 48 to output a charge pump signal that increases the frequency of the output signal S3. Similarly, the periods of the UP pulses can be shortened, or the periods of the DOWN pulses lengthened, to cause the charge pump 48 to output a charge pump signal that decreases the frequency of the output signal S3. The pulse reshaper 46 can perform period reshaping of the pulses of the UP and DOWN signals to generate a reshaped phase error signal that is a composite of the reshaped UP and DOWN signals, also generally comprising pulses, that is sent to the charge pump 48.

Signal reshaping can also be accomplished by the controller 54 controlling voltages and currents of the charge pump 48 to change amplitudes of the output charge pump signal pulses. For instance, if amplitudes of the pulses comprising the phase error signal are too low or too high, the controller 54 can control the charge pump 48 to respectively increase or decrease the amplitudes accordingly.

Figure 4:
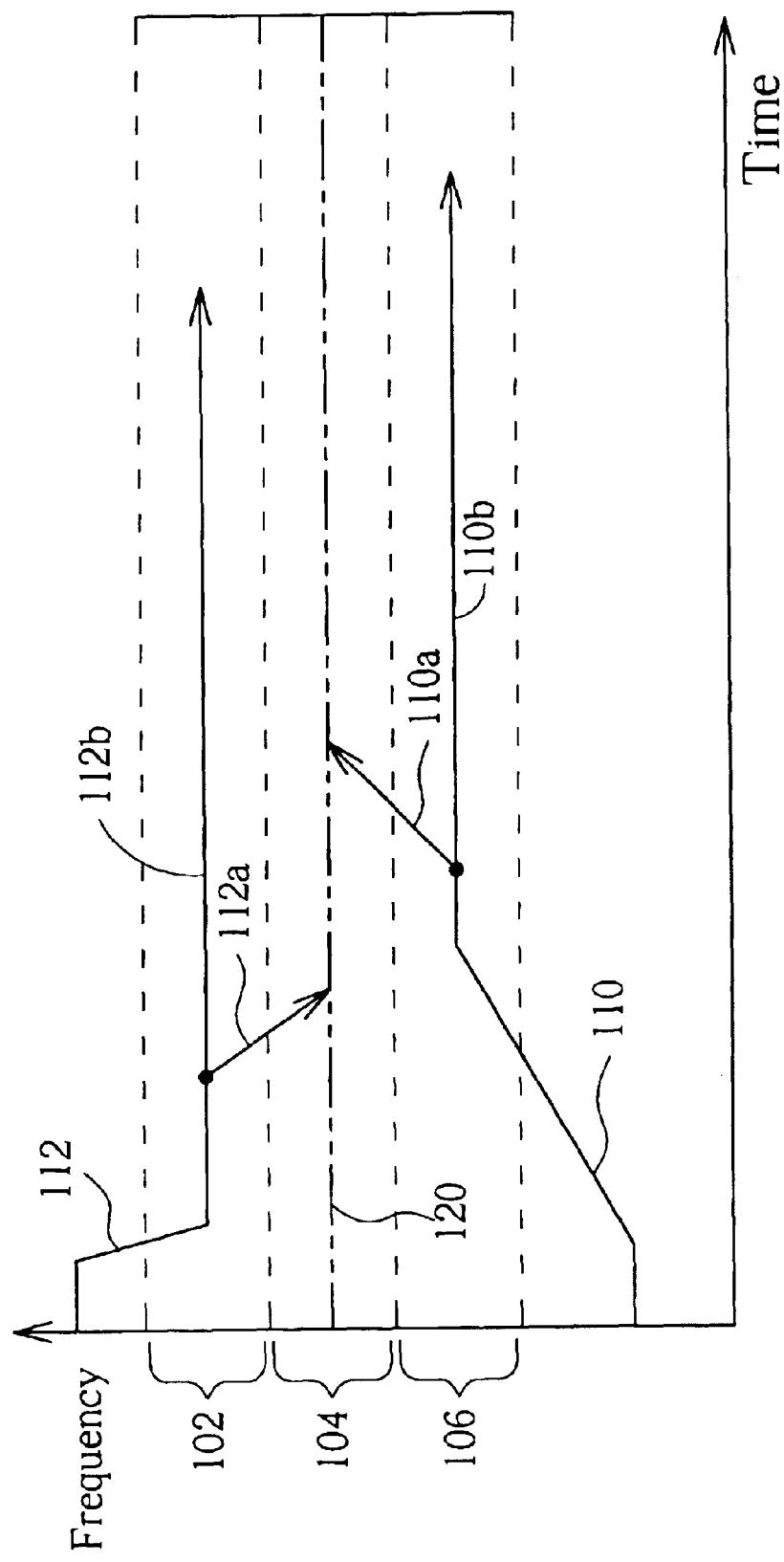
FIG. 4 is a graph of an output signal of the phase-locked loop of FIG. 3.

Please refer to FIG. 4. FIG. 4 shows a frequency versus time graph of output signals for the phase-locked loop 40. As previously mentioned, output of the phase-locked loop 40 can be taken as the output signal S3. Moreover, in many applications it is required that a target frequency 120 for the output signal S3 be set. An upper range 102 and a lower range 106 are ranges of frequencies where the frequency of the output signal S3 may not converge to the target frequency 120 without pulse reshaping. At frequencies above the upper range 102 and below the lower range 106, the frequency detector 44 is effective in directing the frequency of the output signal S3 towards the target frequency 120. Similarly, at frequencies in a lock range 104, between the ranges 102, 106 near the target frequency 120, the unreshaped phase error signal output by the phase detector is adequate to drive the frequency of the output signal S3 to the target frequency 120.

To prevent the output signal S3 from drifting when in the so called "dead zone" upper and lower ranges 102, 106, the pulse reshaper 46 or the charge pump 48 as controlled by the controller 54 perform the aforementioned signal reshaping. Consider an output signal 110 as an example of the output signal S3. The frequency of the output signal 110 is directed into the lower range 106 by the frequency detector 44. Then, the pulse reshaper 46 or the charge pump 48, as controlled by the controller 54, reshapes the output signal 110 so that the frequency of the output signal 110 is driven to the target frequency 120 as illustrated by a path 110a. On the contrary, the prior art phase-locked loop output signal may become trapped and drift in the lower range 106 as illustrated by a path 110b. In a similar way, the pulse reshaper 46 or the charge pump 48 directs an output signal 112 to the target frequency through a path 112a. However, without signal reshaping as in the prior art, the output signal 112 can become trapped in the upper range 102. Consequently, the UP and DOWN pulse period reshaping provided by the pulse reshaper 46, and the pulse amplitude reshaping provided by the charge pump 48 as controlled by the controller 54 provide for the direct and efficient path 110a or 112a to synchronize the frequency of the respective output signal 110 or 112 to the target frequency.

Figure 5:
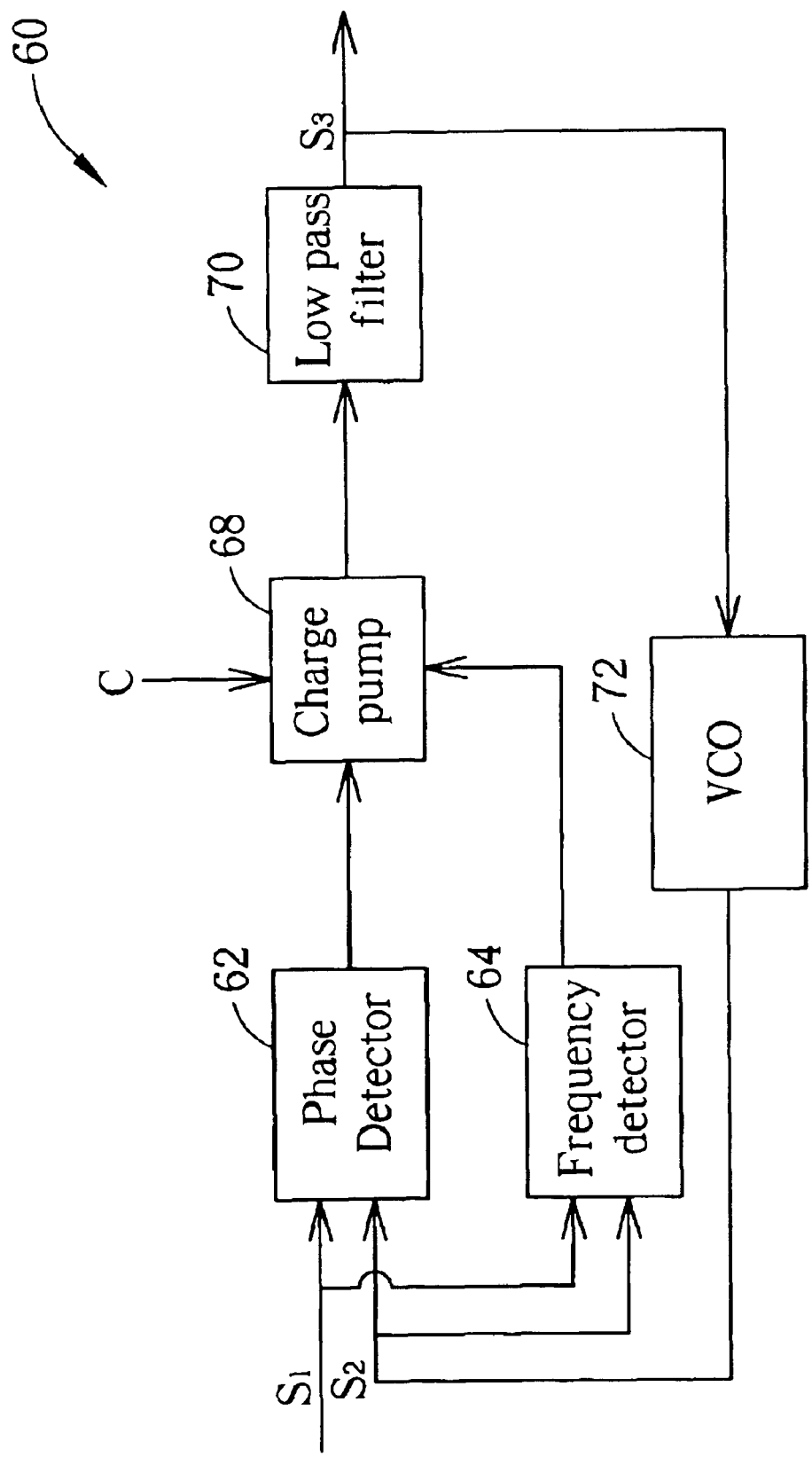
FIG. 5 is a block diagram of a phase-locked loop according to a second preferred embodiment of the present invention.

The second preferred embodiment of the present invention is illustrated in FIG. 5. A phase-locked loop 60 includes a phase detector 62, a frequency detector 64, a charge pump 68, a low pass filter 70, and a VCO 72. The phase detector 62 and the frequency detector 64 of the phase-locked loop 60 receive an input signal S1 and a feedback signal S2, and respectively output a phase error signal and a frequency error signal to the charge pump 68. The phase error signal and the frequency error signal can be pulsed signals similar to the first preferred embodiment. Output of the charge pump 68 is received by the low pass filter 70, filtered, output as the output signal S3, and sent to the VCO 72. The VCO 72 generates and outputs the feedback signal S2 based on the received output signal S3.

Referring to FIG. 5 and FIG. 4, the charge pump 68 can reshape the error signals output by the phase detector 62 and the frequency detector 64 based on the tuning of a control signal C. When the phase error signal comprises pulses, the charge pump 68 can change amplitudes of the pulses. The control signal C includes the output signal S3 and the target frequency 120 as shown in FIG. 4. The charge pump 68 includes suitable logic to determine when the frequency of the output signal S3 is in the upper or lower ranges 102, 106 of FIG. 4. For instance, when the output signal 112 is in the upper range 102, the control signal C causes the charge pump 68 to reshape the phase error signal to quickly drive the frequency of the output signal 112 to the target frequency 120. Similar phase error signal reshaping is performed by the charge pump 68 when the output signal 110 is in the lower range 106. As a result, the charge pump 68 according to the present invention accelerates convergence of the output signal S3 to a target frequency based on the control signal C.

The present invention can be practically realized by digital or analog electronic components. Moreover, the phase-locked loops 40, 60 can be made of discrete components or can be built into a single IC circuit. Applications of the present invention specifically include control circuits for compact disk (CD) drives and digital versatile disk (DVD) drives, and clock recovery from eight-to-fourteen modulation (EFM) signals. Suitable frequency dividers can be added to the phase-locked loops 40, 60 to facilitate varied applications. Generally, for both embodiments described, specific signal reshaping performed by the reshaper 46 and the charge pump 68 depends on characteristics of signals involved.

In contrast to the prior art, the present invention phase-locked loop provides signal reshaping to accelerate synchronization of an output signal to a target frequency. The signal reshaping is accomplished by a pulse reshaper that lengthens or shortens periods of pulses, and by a charge pump that changes amplitudes of pulses as controlled by a controller. The output signal is thus prevented from becoming trapped in dead zones associated with prior art phase-locked loops. The signal reshaping provided by the pulse reshaper and the charge pump improves the overall response of the present invention phase-locked loop over the prior art.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A phase-locked loop comprising:

a phase detector for receiving an input signal and a feedback signal, and for outputting a phase error signal based on a phase difference between the input signal the feedback signal;

a signal reshaper connected to the phase detector for reshaping the phase error signal;

a charge pump connected to the signal reshaper for receiving the reshaped or unreshaped phase error signal from the signal reshaper and for outputting a charge pump signal;

a low pass filter connected to the charge pump for receiving the charge pump signal and outputting an output signal;

a voltage-controlled oscillator connected between the low pass filter and the phase detector for receiving the output signal and for outputting a corresponding oscillation signal, wherein the feedback signal inputted into the phase detector is generated from the oscillation signal; and a controller connected to the signal reshaper and the charge pump for controlling the signal resphaper and the charge pump;

wherein the unreshaped phase error signal causes the charge pump to output a charge pump signal that changes the frequency of the feedback signal to match the frequency of the input signal, and the reshaped phase error signal causes the charge pump to output a charge pump signal that synchronizes the output signal with a target frequency.

2. The phase-locked loop of claim 1 further comprising a frequency detector connected between the voltage-controlled oscillator and the charge pump for receiving the input signal and the feedback signal and for outputting a frequency difference signal to the charge pump.

3. The phase-locked loop of claim 1 wherein when the frequency of the output signal is in a lower range that is lower than the target frequency, the signal reshaper reshapes the phase error signal to increase the frequency of the output signal out of the lower range; and when the frequency of the output signal is in an upper range that is above the target frequency, the signal reshaper reshapes the phase error signal to decrease the frequency of the output signal out of the upper range.

4. The phase-locked loop of claim 3 wherein the lower range and the upper range are frequency ranges where the unreshaped phase error signal is incapable of synchronizing the output signal with the target frequency.

5. The phase-locked loop of claim 1 wherein the signal reshaper is a pulse reshaper and the phase error signal comprises up pulses and down pulses.

6. The phase-locked loop of claim 5 wherein the pulse reshaper lengthens or shortens a period of a pulse of the phase error signal.

7. The phase-locked loop of claim 5 wherein the pulse reshaper increases or decreases a width of a pulse.

8. The phase-locked loop of claim 1 wherein the charge pump increases or decreases an amplitude of a current.

9. The phase-locked loop of claim 1 wherein the input signal is an eight-to-fourteen modulation (EFM) signal and the output signal is a clock signal, and the phase-locked loop is incorporated into a controller of a compact disk (CD) drive or a digital versatile disk (DVD) drive.

* * * * *